(12) United States Patent
Reznicek et al.

(10) Patent No.: US 11,133,217 B1
(45) Date of Patent: Sep. 28, 2021

(54) LATE GATE CUT WITH OPTIMIZED CONTACT TRENCH SIZE

(71) Applicant: International Business Machines Corporation, Armonk, NY (US)

(72) Inventors: Alexander Reznicek, Troy, NY (US); Balasubramanian S. Pranatharthi Haran, Watervliet, NY (US); Praneet Adusumilli, Somerset, NJ (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/832,167

(22) Filed: Mar. 27, 2020

(51) Int. Cl.
| | |
|---|---|
| *H01L 21/768* | (2006.01) |
| *H01L 29/78* | (2006.01) |
| *H01L 29/66* | (2006.01) |
| *H01L 29/40* | (2006.01) |
| *H01L 29/423* | (2006.01) |

(52) U.S. Cl.
CPC .. *H01L 21/76895* (2013.01); *H01L 21/76816* (2013.01); *H01L 29/401* (2013.01); *H01L 29/4236* (2013.01); *H01L 29/66795* (2013.01); *H01L 29/785* (2013.01)

(58) Field of Classification Search
CPC ........... H01L 29/66795; H01L 29/4236; H01L 29/785; H01L 21/76816
See application file for complete search history.

(56) References Cited

U.S. PATENT DOCUMENTS

| | | | |
|---|---|---|---|
| 8,741,701 B2 | 6/2014 | Cheng et al. | |
| 9,064,932 B1 | 6/2015 | Pham et al. | |
| 9,704,754 B1 | 7/2017 | Bao et al. | |
| 9,761,495 B1 | 9/2017 | Xie et al. | |
| 9,818,836 B1 | 11/2017 | Sung et al. | |
| 9,837,276 B2 | 12/2017 | Greene et al. | |
| 9,991,361 B2 | 6/2018 | Dai et al. | |
| 10,084,053 B1 | 9/2018 | Xie et al. | |
| 10,177,037 B2 | 1/2019 | Zang et al. | |
| 10,236,213 B1 | 3/2019 | Pandey et al. | |
| 2018/0277645 A1* | 9/2018 | Xie ................. | H01L 21/823431 |

* cited by examiner

*Primary Examiner* — Changhyun Yi
(74) *Attorney, Agent, or Firm* — Scully, Scott, Murphy & Presser, P.C.; L. Jeffrey Kelly, Esq.

(57) ABSTRACT

A semiconductor structure is provided including a gate cut region in which the contact trench size has been optimized to increase local interconnect connectivity. The semiconductor structure can include at least one gate structure located laterally adjacent to a gate cut region. At least one metal-containing contact structure is located in the gate cut region, wherein the at least one at least one metal-containing contact structure is confined by a pair of gate dielectric spacers, wherein a first gate dielectric spacer of the pair of gate dielectric spacers has a first width and is located laterally adjacent to the at least one gate structure, and a second gate dielectric spacer of the pair of gate dielectric spacers has a second width and is located laterally adjacent to the at least one metal-containing contact structure, wherein the first width is greater than the second width.

19 Claims, 18 Drawing Sheets

LATE GATE CUT WITH OPTIMIZED CONTACT TRENCH SIZE

BACKGROUND

The present application relates to a semiconductor structure and a method of forming the same. More particularly, the present application relates to a semiconductor structure including a gate cut region in which the contact trench size has been optimized to increase local interconnect connectivity.

In order to prevent epitaxy nodules, epitaxy source-to-drain shorts and etch line damage, a gate cut has been introduced into standard semiconductor device manufacturing. One problem associated with conventional gate cut processes is that after the gate cut, the space between the nitride liner and the semiconductor fin becomes smaller and this space could easily pinch-off with amorphous silicon during a high-k reliability anneal, thus causing leakage issues.

Contact resistant reduction by trench contact implantation is now a well known method to reduce device access resistance ($R_{on}$) and improve performance. Two soft masks are used to mask the p-type field effect transistor (pFET) device region and n-type field effect transistor (nFET) device region, respectively, while at the unmasked (open) section the resistance reducing species is implanted.

Those contact implants need to be integrated after contact trench formation with the nitride liner still in place to protect the source/drain epitaxy from damage, like ashing and interaction with patterning films and any wet pre-cleans. High germanium percentage silicon germanium in pFET devices is especially vulnerable to such processes.

In the prior art, the pFET and nFET contact implantation soft masks only cover the active pFET device region or the active nFET device region, respectively, and are thus underlapped.

Implanting through and into the nitride liner will lead to changes in the etch rate of the nitride liner. This leads to a significantly smaller trench size at the pFET and nFET device boundary over the shallow trench isolation region compared to the respective device regions. This will lead to increased lateral trench resistance and has an overall negative impact on device performance.

SUMMARY

A semiconductor structure is provided including a gate cut region in which the contact trench size has been optimized to increase local interconnect connectivity. In one embodiment, the semiconductor structure includes at least one gate structure located laterally adjacent to a gate cut region. At least one metal-containing contact structure is located in the gate cut region. The at least one metal-containing contact structure is confined by a pair of gate dielectric spacers, wherein a first gate dielectric spacer of the pair of gate dielectric spacers has a first width and is located laterally adjacent to the at least one gate structure, and a second gate dielectric spacer of the pair of gate dielectric spacers has a second width and is located laterally adjacent to the at least one metal-containing contact cut region, wherein the first width is greater than the second width.

In another embodiment, the semiconductor structure includes at least one gate structure located laterally adjacent to a gate cut region. At least one metal-containing contact cut region is present in the gate cut region. The at least one metal-containing contact cut region is confined by a pair of gate dielectric spacers, wherein a first gate dielectric spacer of the pair of gate dielectric spacers has a first width and is located laterally adjacent to the at least one gate structure, and a second gate dielectric spacer of the pair of gate dielectric spacers has a second width and is laterally adjacent to the at least one metal-containing contact cut region, wherein the first width is greater than the second width.

In another aspect of the present application, a method of forming a semiconductor structure of provided. In one embodiment, the method includes forming a plurality of gate structures, wherein a gate dielectric spacer is located on the sidewall of each gate structure and an epitaxial source/drain structure is located on each side of the gate structures. An organic planarization layer (OPL) is then formed in a gap that is located between each gate structure and on each epitaxial source/drain structure. A hard mask having an opening, which defines a gate cut region in which at least one gate structure will be subsequently cut, is formed. Next, the height of each gate dielectric spacer that is present in the gate cut region is reduced. A silicon nitride layer is then formed in the gate cut region and in an area previously occupied by a removed gate structure. The physically exposed OPL in the gate cut region is thereafter removed, and then the gate dielectric spacers present in the gate cut region are thinned. Next, the hard mask and remaining OPL are removed, and thereafter at least one metal-containing contact structure is formed in the gate cut region and laterally adjacent to each gate structure.

DETAILED DESCRIPTION

Figure 1A:
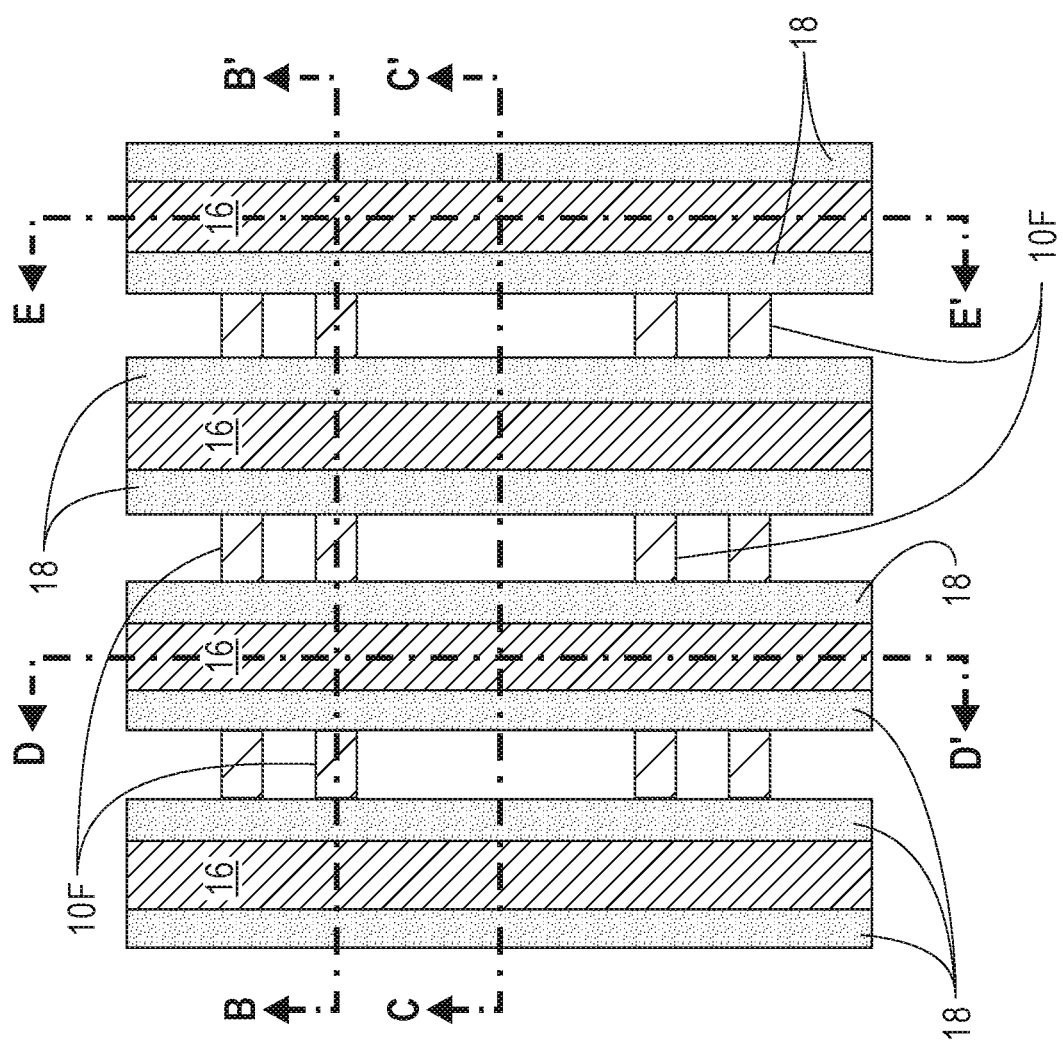
FIG. 1A is a top-down view of an exemplary semiconductor structure that can be used in accordance with an embodiment of the present application, including a plurality of gate structures located on a semiconductor fin, wherein a gate dielectric spacer is located on the sidewall of each gate structure and an epitaxial source/drain structure (not shown in the top down view) is located on each side of the gate structures.
Figure 1B:
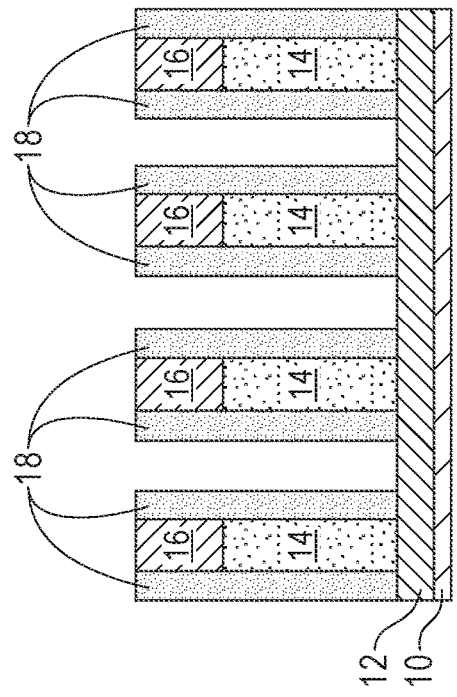
FIG. 1B is a cross sectional view of the exemplary structure of FIG. 1A along cut B-B'.
Figure 1C:
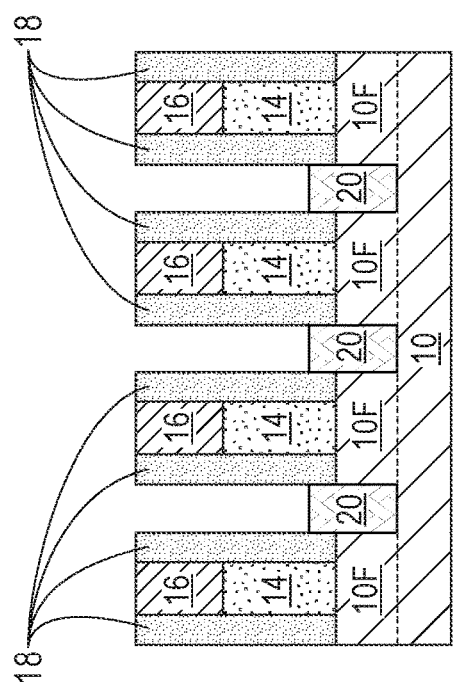
FIG. 1C is a cross sectional view of the exemplary structure of FIG. 1A along cut C-C'.
Figure 1D:
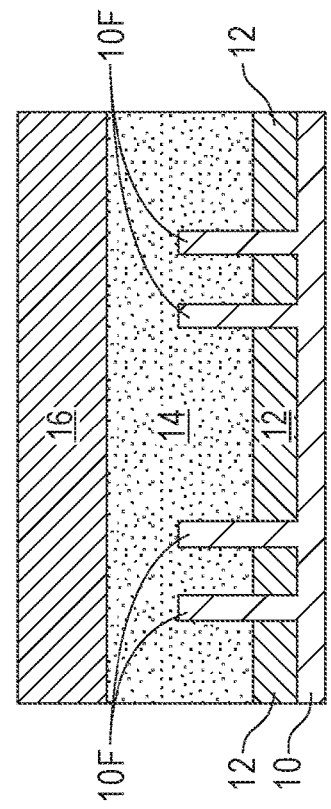
FIG. 1D is a cross sectional view of the exemplary structure of FIG. 1A along cut D-D'.
Figure 1E:
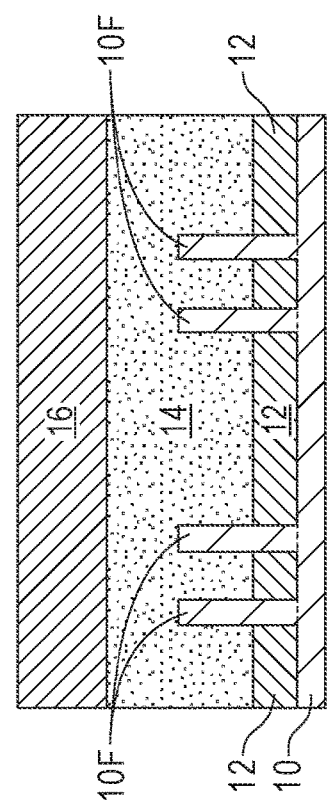
FIG. 1E is a cross sectional view of the exemplary structure of FIG. 1A along cut E-E'.
Figure 2A:
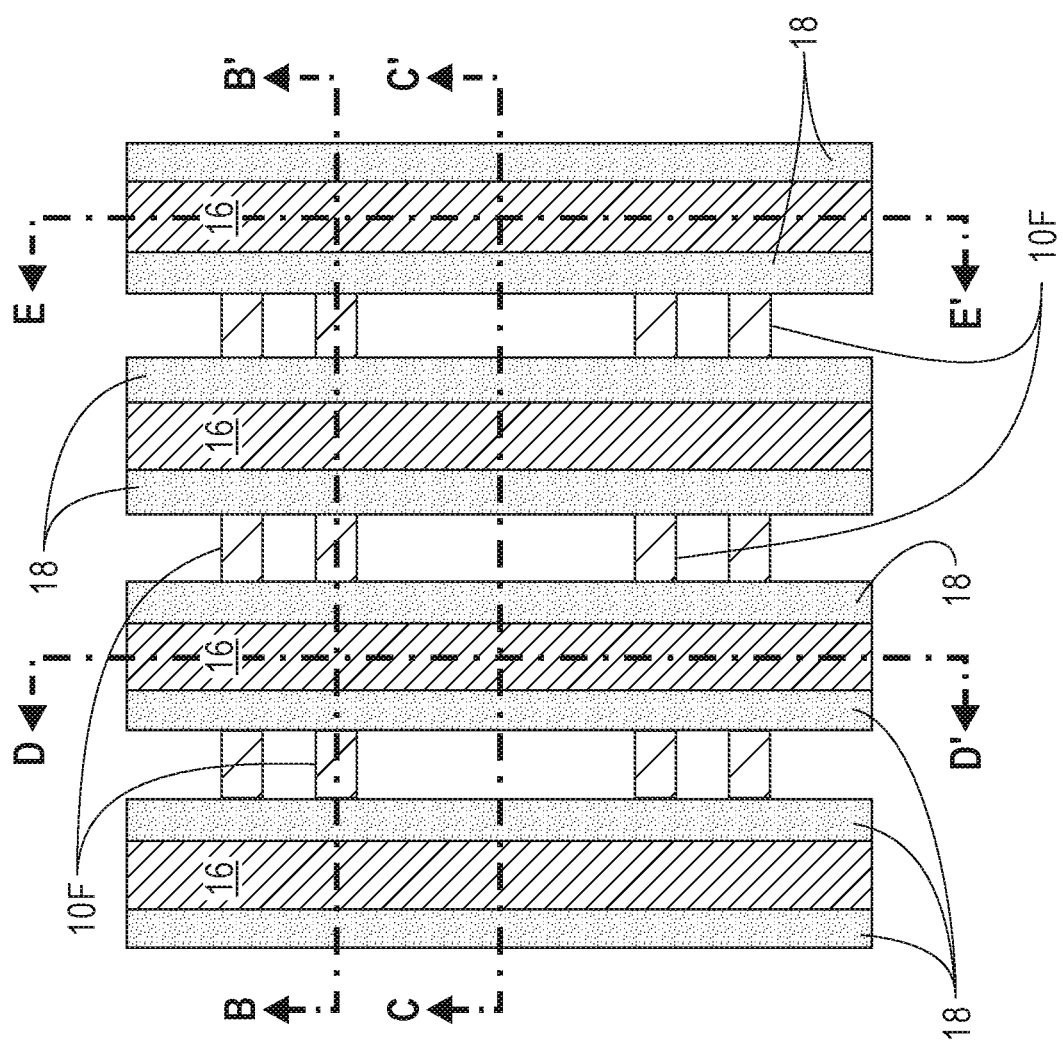
FIG. 2A is a top-down view of the exemplary semiconductor structure of FIG. 1A after forming an organic planarization layer (OPL) in a gap that is located between each gate structure and on each epitaxial source/drain structure.
Figure 2B:
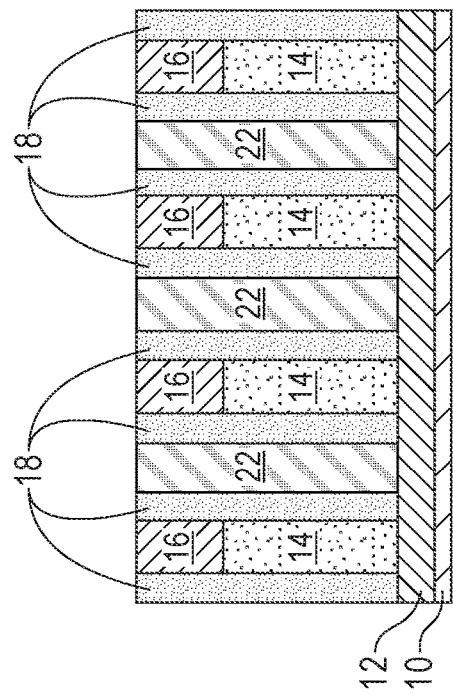
FIG. 2B is a cross sectional view of the exemplary structure of FIG. 2A along cut B-B'.
Figure 2C:
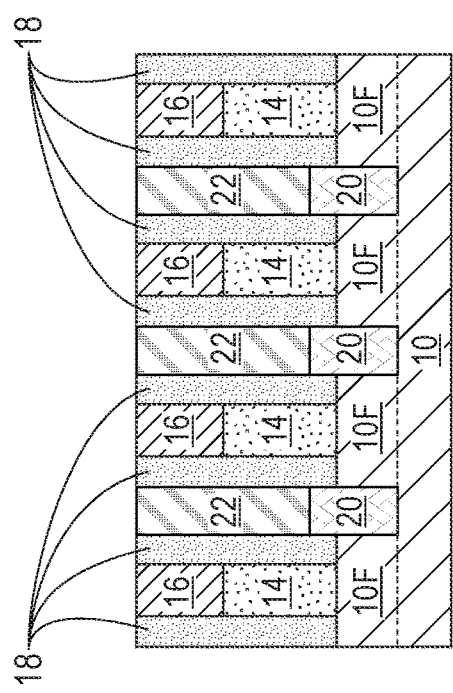
FIG. 2C is a cross sectional view of the exemplary structure of FIG. 2A along cut C-C'.
Figure 2D:
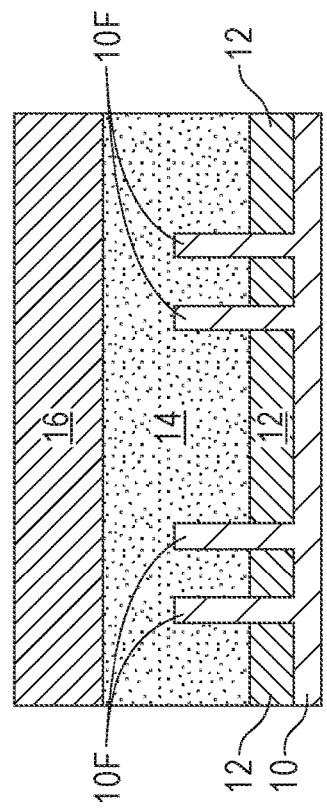
FIG. 2D is a cross sectional view of the exemplary structure of FIG. 2A along cut D-D'.
Figure 2E:
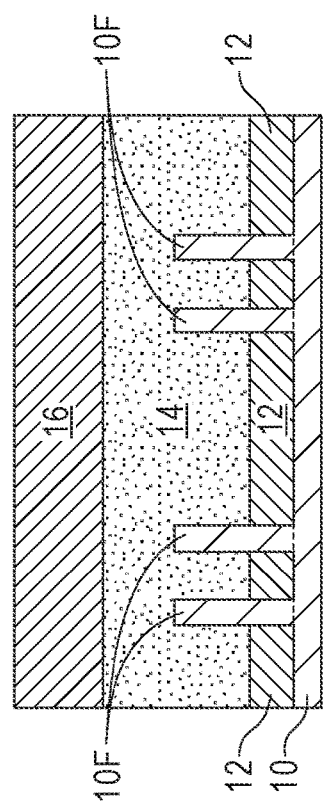
FIG. 2E is a cross sectional view of the exemplary structure of FIG. 2A along cut E-E'.
Figure 3A:
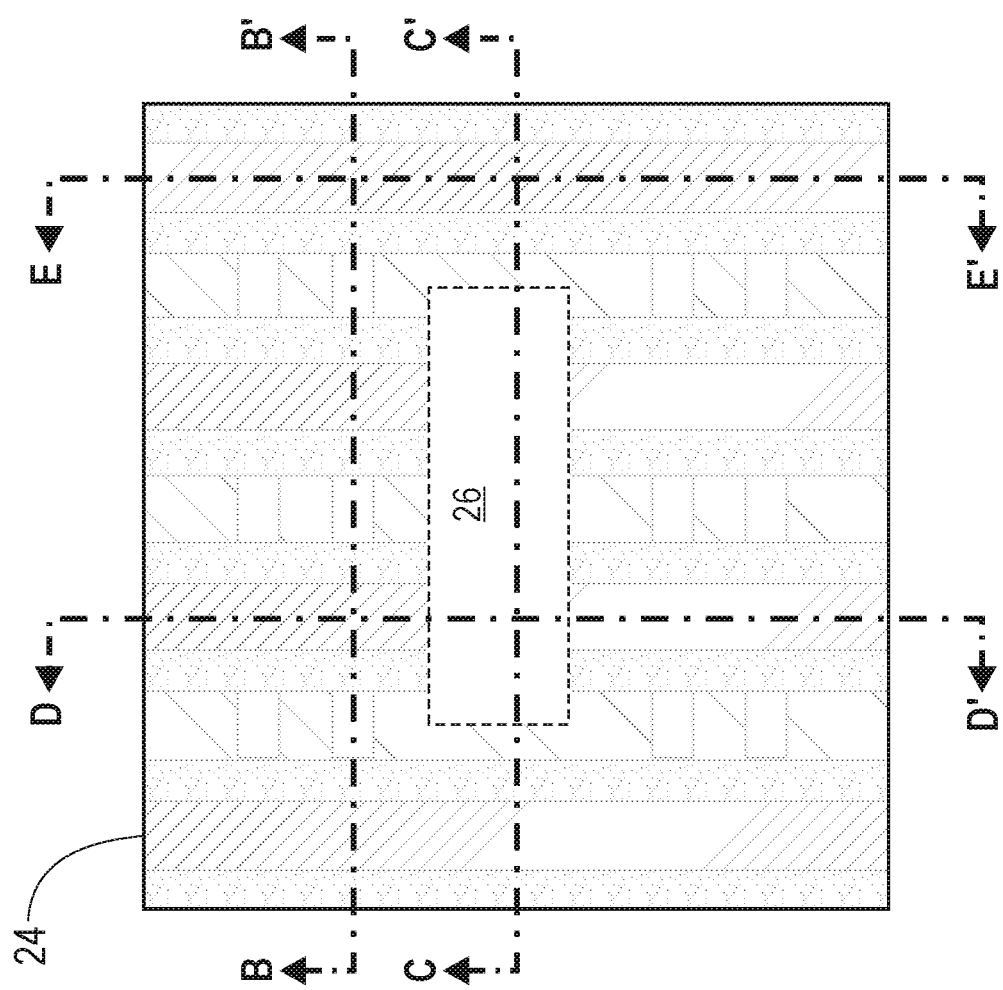
FIG. 3A is a top-down view of the exemplary semiconductor structure of FIG. 2A after forming a hard mask having an opening which defines a gate cut region in which at least one gate structure will be subsequently cut.
Figure 3C:
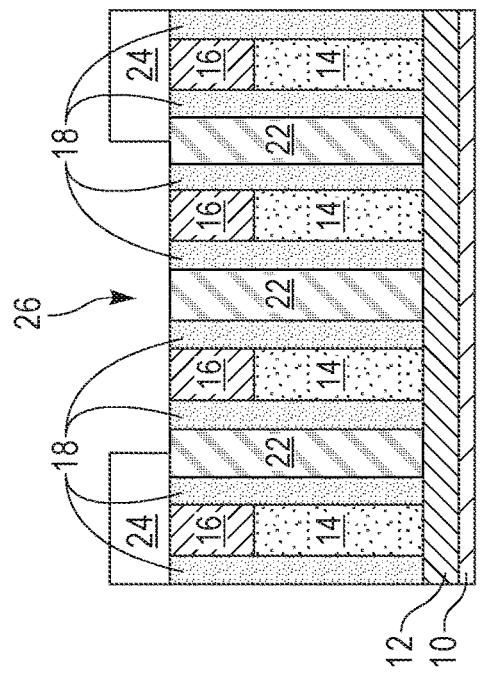
FIG. 3C is a cross sectional view of the exemplary structure of FIG. 3A along cut C-C'.
Figure 3E:
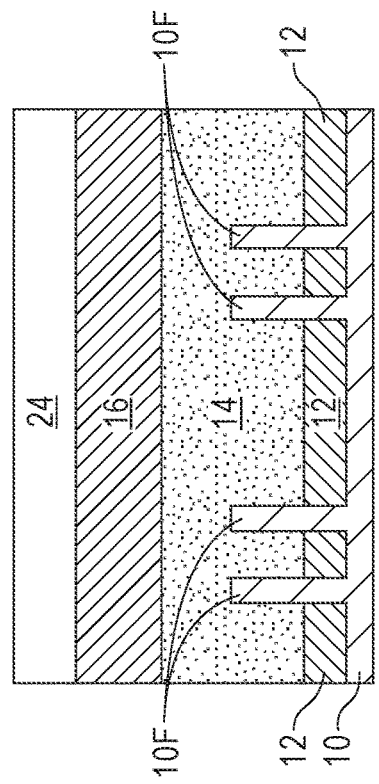
FIG. 3E is a cross sectional view of the exemplary structure of FIG. 3A along cut E-E'.
Figure 3B:
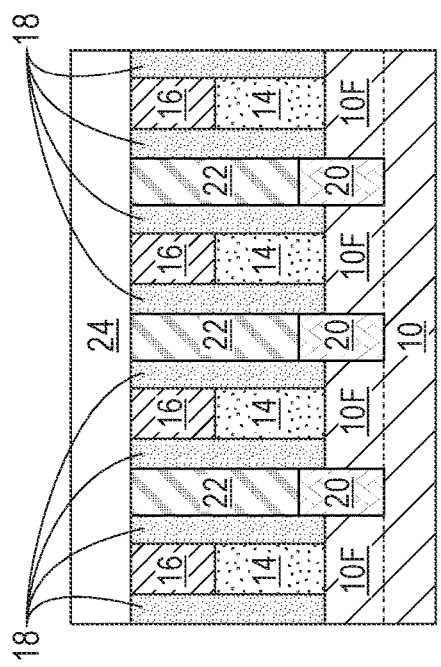
FIG. 3B is a cross sectional view of the exemplary structure of FIG. 3A along cut B-B'.
Figure 3D:
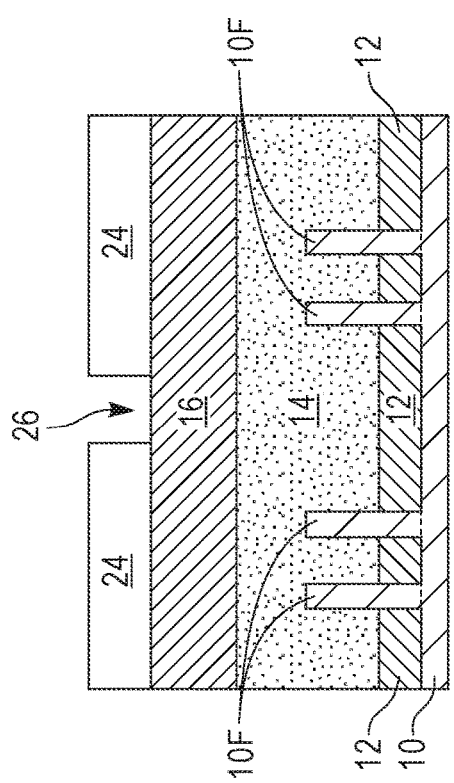
FIG. 3D is a cross sectional view of the exemplary structure of FIG. 3A along cut D-D'.
Figure 4A:
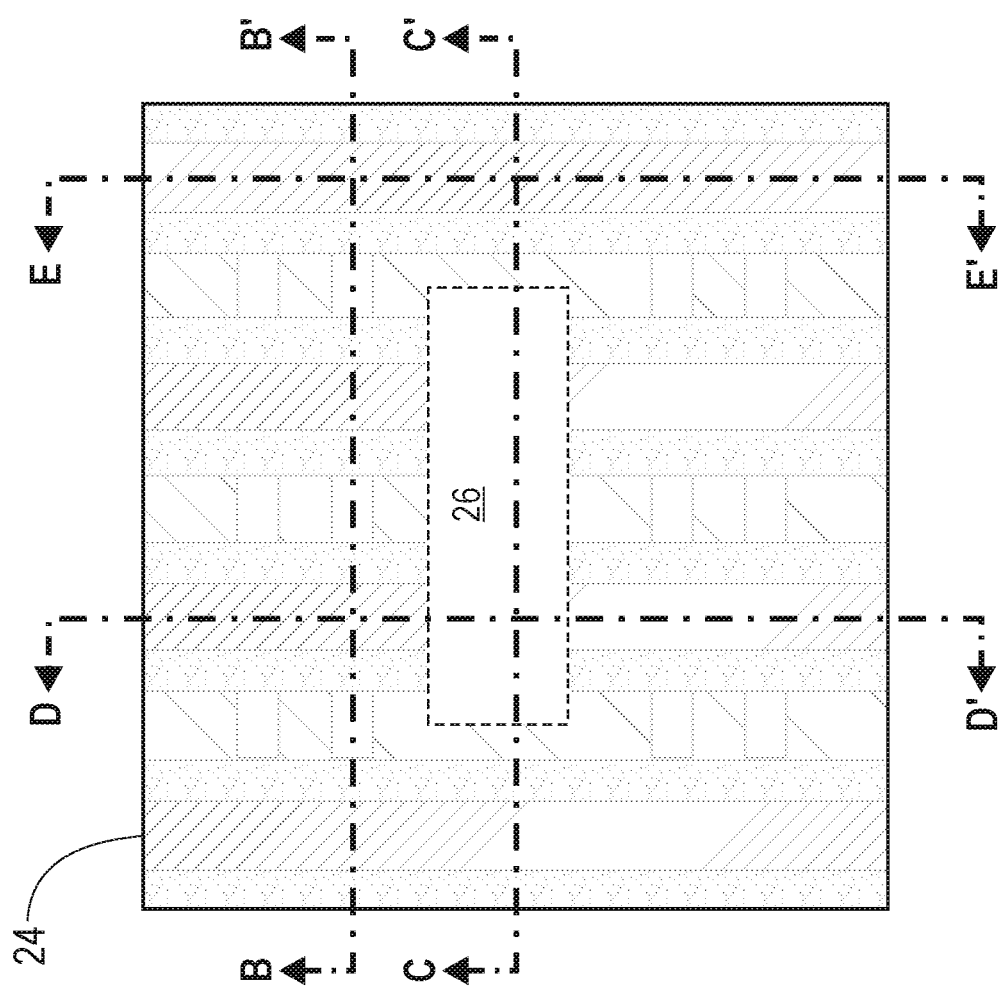
FIG. 4A is a top-down view of the exemplary semiconductor structure of FIG. 3A after removing a gate cap that is present on each of the gate structures that is present in the gate cut region, and reducing the height of each gate dielectric spacer that is present in the gate cut region.
Figure 4C:
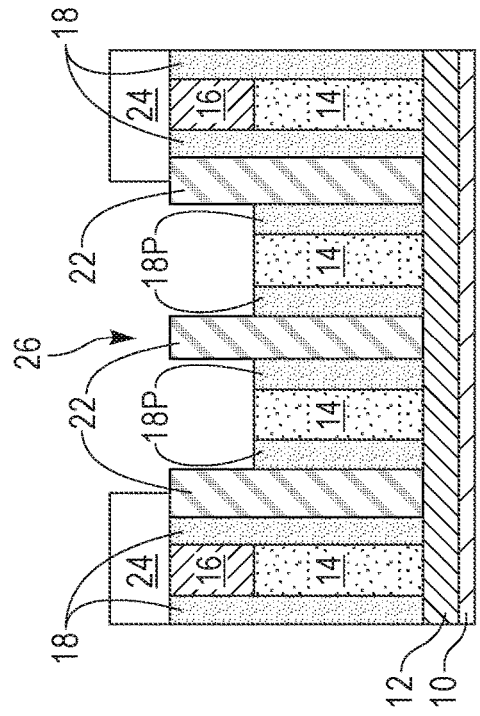
FIG. 4C is a cross sectional view of the exemplary structure of FIG. 4A along cut C-C'.
Figure 4E:
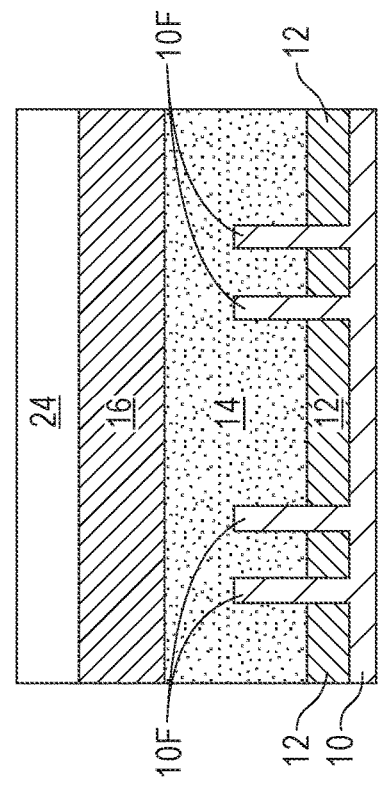
FIG. 4E is a cross sectional view of the exemplary structure of FIG. 4A along cut E-E'.
Figure 4B:
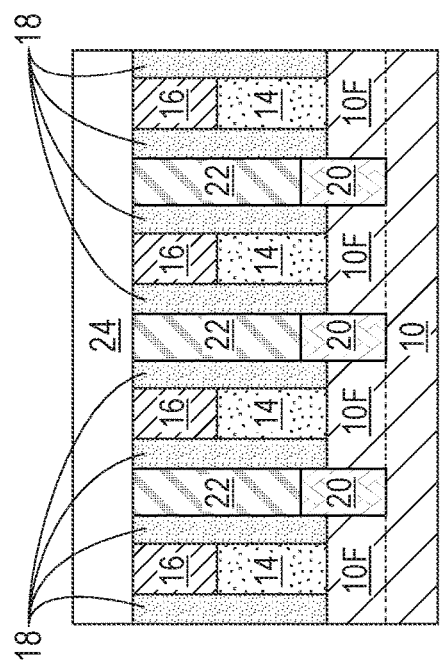
FIG. 4B is a cross sectional view of the exemplary structure of FIG. 4A along cut B-B'.
Figure 4D:
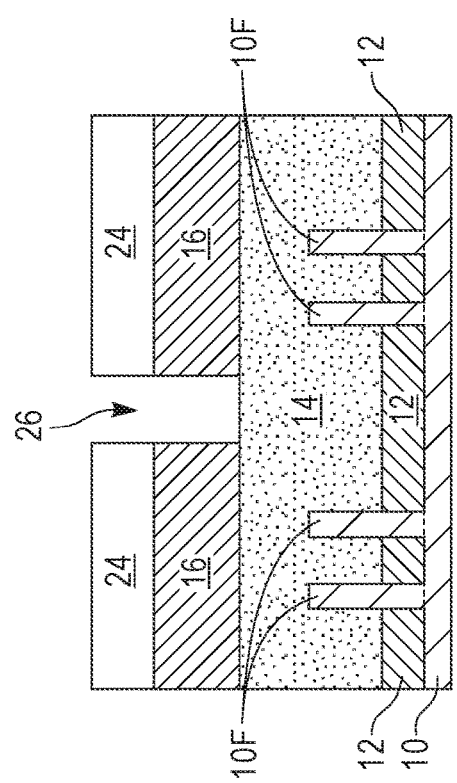
FIG. 4D is a cross sectional view of the exemplary structure of FIG. 4A along cut D-D'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the present application provides various views of the basic processing steps that can be used in the present application. Notably, each of the illustrated steps includes a top down view (FIGS. 1A, 2A, 3A, 4A, 5A, 6A, 7A, 8A and 9A) of the exemplary structure after performing a particular process step or a series of processing steps. Each of the top down views contains cut B-B' (FIGS. 1B, 2B, 3B, 4B, 5B, 6B, 7B, 8B and 9B), cut C-C' (FIGS. 1C, 2C, 3C, 4C, 5C, 6C, 7C, 8C and 9C), cut D-D' (FIGS. 1D, 2D, 3D, 4D, 5D, 6D, 7D, 8D and 9D), and cut E-E' (FIGS. 1E, 2E, 3E, 4E, 5E, 6E, 7E, 8E and 9E). Cut B-B' is a cross sectional view along one of the semiconductor fins, cut C-C' is a cross sectional view over a shallow trench isolation region, cut D-D' is a cross sectional view in a portion of a gate cut region, and cut E-E' is a cross sectional view along the lengthwise direction of a gate structure. In the present application, the semiconductor fins are oriented parallel to each other, the gate structures are oriented parallel to each other, and each gate structure runs perpendicular to each of the semiconductor fins. It is noted that in some instances and for clarity, the top down view does not show each and every element that is present in the exemplary structure. Also, and in some instances, the top down view contains an upper material that is shown in transparency so as to illustrate the various elements that are present beneath the upper material.

Referring first to FIGS. 1A, 1B, 1C, 1D and 1E, there are illustrated various views of an exemplary semiconductor structure that can be used in accordance with an embodiment of the present application. Notably, the exemplary structure illustrated in FIGS. 1A, 1B, 1C, 1D and 1E includes a plurality of gate structures 14 located on a semiconductor fin 10F, wherein a gate dielectric spacer 18 is located on the sidewall of each gate structure 14 and an epitaxial source/drain structure 20 (not shown in the top down view) is located on each side of the gate structures 14. As is further shown in FIGS. 1A, 1B, 1C, 1D and 1E, each semiconductor fin 10F extends upward from a surface of a semiconductor substrate 10, each gate structure 14 includes a gate cap 16, and a shallow trench isolation region 12 is located on the semiconductor substrate 10 and contacting a lower portion of each of the semiconductor fins 10F.

It is noted that the number of semiconductor fins 10F is not limited to the number of semiconductor fins 10F illustrated in the drawings of the present application. Instead, the present application works when at least one single semiconductor fin 10F is formed. Also, the number of gate structures 14 is not limited to the number of gate structures shown in the drawings of the present application. Instead, the present application works when at least two gate structures 14 are formed.

As can be seen in the drawings, the gate structures 14 and the gate dielectric spacers 18 are both located on a semiconductor fin 10F and each extends onto a surface of the shallow trench isolation region 12.

The exemplary structure shown in FIGS. 1A, 1B, 1C, 1D, and 1E can be formed utilizing processing techniques that are well known to those skilled in the art. For example, the exemplary structure shown in FIGS. 1A, 1B, 1C, 1D, and 1E can formed by first providing a base semiconductor substrate (not shown); the base semiconductor substrate is subsequently processed into semiconductor substrate 10 that includes a plurality of semiconductor fins 10F extending upwards therefrom. The base semiconductor substrate is composed of any semiconductor material having semiconducting properties. Illustrative examples of semiconductor materials that can be used as the base semiconductor substrate include, but are not limited to, silicon (Si), germanium (Ge), a silicon germanium alloy (SiGe), silicon carbide (SiC), silicon germanium carbide (SiGeC), a III-V compound semiconductor or a II-VI compound semiconductor.

The semiconductor fins 10F are then formed utilizing a patterning process. In one embodiment, the patterning process used to define the semiconductor fins 10F includes lithography and etching. In another embodiment of the present application, the patterning process used to define the semiconductor fins 10F includes a sidewall image transfer (SIT) process. In yet another embodiment of the present application, the patterning process used to define the semiconductor fins 10F includes a direct self-assembly (DSA) patterning method. Notwithstanding the type of patterning process used to define the semiconductor fins 10F, the semiconductor fins 10F and the semiconductor substrate 10 are composed of one of the semiconductor materials mentioned above for base semiconductor substrate. In some embodiments, the semiconductor fins 10F are composed of a compositionally same semiconductor material as the semiconductor substrate 10; in such an embodiment no material interface exists between the semiconductor fins 10F and the semiconductor substrate 10. In one example, the semiconductor fins 10F and the semiconductor substrate 10 are both composed of silicon. In other embodiments, the semiconductor fins 10F are composed of a compositionally different semiconductor material than the semiconductor substrate 10; in such an embodiment a material interface exists between the semiconductor fins 10F and the semiconductor substrate 10. In the drawings, a dotted line is shown between the semiconductor fins 10F and the semiconductor substrate 10 to illustrate the location of a possible material interface between the semiconductor fins 10F and the semiconductor substrate 10. In one example, the semiconductor fins 10F are composed of SiGe or a III-V compound semiconductor, while the semiconductor substrate 10 is composed of silicon.

The term "semiconductor fin" is used in the present application to define a semiconductor material structure that includes a pair of vertical sidewalls that are parallel to each other. A surface is "vertical" if there exists a vertical plane from which the surface does not deviate by more than three times the root mean square roughness of the surface. Each semiconductor fin 10F can have a height from 20 nm to 150 nm, a width from 4 nm to 80 nm, and a length from 6 nm to 1000 nm; although heights and/or widths and/or lengths of the semiconductor fins 10F are possible and can be used in the present application.

After providing the semiconductor fins 10F, the shallow trench isolation region (or STI region) 12 is formed on the surface of the semiconductor substrate 10 and in a gap that is located between each of the semiconductor fins 10F; the STI region 12 can also be referred to herein as a local isolation structure. The STI region 12 contacts a lower portion of each of the semiconductor fins 10F, and the STI region 12 has a topmost surface that is located beneath a topmost surface of each of the semiconductor fins 10F; stated in other terms the height of the STI region 12 is less than the height of each of the semiconductor fins 10F. The STI region 12 can be formed by first depositing a trench dielectric material such as, for example, a trench dielectric oxide (e.g., silicon dioxide). The depositing of the trench dielectric material can include chemical vapor deposition (CVD), plasma enhanced chemical vapor deposition (PECVD) or physical vapor deposition (PVD). In some embodiment, a planarization and/or an etch process can follow the depositing of the trench dielectric material.

After forming the STI region 12, the gate structures 14 are typically formed utilizing processing techniques well known to those skilled in the art. In some embodiments, the gate structures are formed utilizing a replacement gate process. For example, sacrificial gate structures (not shown) with a thin layer of oxide and amorphous Si are first formed, and then the sacrificial gate structures are replaced with gate structures 14 that are typically capped with gate cap 16. The replacement of the sacrificial gate caps can include removing the sacrificial gate structure forming a high-k metal gate, followed by gate recess, with a gate cap 16 being formed on top of the metal gate. The sacrificial gate structure patterning is typically done by lithography and a dry etch process, including EUV lithography, Litho-etch-litho-etch (LELE), or SADP patterning techniques. The gate dielectric spacer 18 and epitaxial source/drain structures 20 are typically formed after the patterning of the sacrificial gates.

The gate dielectric spacer 18 includes any gate dielectric spacer material such as, for example, silicon dioxide, silicon nitride and/or silicon oxynitride. The gate dielectric spacer material that provides the gate dielectric spacer 18 can be compositionally the same as, or compositionally different than the dielectric material that provides the gate caps 16.

The gate dielectric spacer 18 is formed by deposition, followed by a spacer etch such as, for example, reactive ion etching.

The epitaxial source/drain structures 20 are formed from exposed sidewalls of the semiconductor fin 10F and upward from surface of the semiconductor substrate 10. The epitaxial source/drain structures 20 are composed of a semiconductor material, as defined above for the base semiconductor substrate, and a p-type dopant or an n-type dopant. The semiconductor material that provides the epitaxial source/drain structures 20 can be compositionally the same as, or compositionally different from the semiconductor material that provides the semiconductor substrate 10 and/or the semiconductor fins 10F.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The content of p-type or n-type dopant that is present in epitaxial source/drain structures 20 can be from 1E18 atoms/cm$^3$ to 1E21 atoms/cm$^3$. In one example, the epitaxial source/drain structures 20 are composed of boron doped silicon.

The epitaxial source/drain structures 20 can be formed utilizing a selective epitaxial growth process in which a semiconductor material is grown only from a physically exposed semiconductor surface. The terms "epitaxially growing and/or depositing" and "epitaxially grown and deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition can result in crystal defects and film cracking. The epitaxial growth that provides epitaxial source/drain structures 20 can be performed utilizing any well known precursor gas or gas mixture. Carrier gases like hydrogen, nitrogen, helium and argon can be used. The n-type dopant or a p-type dopant that is present in epitaxial source/drain structures 20 is typically included with the precursor gas during the epitaxial growth process.

After the epitaxial source/drain structures 20 are formed is formed, a gate ILD (not shown) is deposited followed by poly open chemical mechanical planarization (CMP), to expose the sacrificial gate structures. The sacrificial gate structure are then removed, followed by formation of a gate structure 14 that includes a gate dielectric material and a gate conductor material.

The gate dielectric material of the gate structures is formed prior to the gate conductor material thus the gate dielectric material contacts physically exposed surfaces (sidewall and topmost) of semiconductor fins 10F. The gate dielectric material can include silicon dioxide and/or a high-k gate dielectric material. The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. The gate dielectric material of gate structures 14 can be formed by any deposition process including, for example, CVD, PECVD, PVD, sputtering, or atomic layer deposition (ALD). In one embodiment of the present application, the gate dielectric material of the gate structures 14 can have a thickness in a range from 1 nm to 10 nm. Other thicknesses that are lesser than, or greater than, the aforementioned thickness range can also be employed for gate dielectric material. In some embodiments, a workfunction metal is formed after the gate dielectric material. The workfunction metal consists of various metals for different devices (e.g., devices with different threshold voltages for both nFET and pFET), and examples of materials include, but are not limited to, TiN, TiC, TiAl, TiAlC, TaN, etc.).

The gate conductor material can include any electrically conductive material such as for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material can be composed of an nFET gate metal. In another embodiment, the gate conductor material can be composed of nFET gate metal.

The gate conductor material can be formed utilizing a deposition process including, for example, CVD, PECVD, PVD, sputtering, ALD or other like deposition processes. When a metal silicide is formed, a conventional silicidation process is employed. In one embodiment, the gate conductor material can have a thickness from 50 nm to 200 nm. Other thicknesses that are lesser than, or greater than, the aforementioned thickness range can also be employed for the gate conductor material.

The gate cap material includes a dielectric material such as, for example, silicon dioxide and/or silicon nitride. The gate cap material that provides the gate caps 16 can be compositionally the same as, or compositionally different from the dielectric material that provides the gate dielectric spacer 18. The gate cap material can be formed by any suitable deposition process such as, for example, CVD or PECVD. In one embodiment, the gate cap material can have a thickness from 10 nm to 100 nm. Other thicknesses that are lesser than, or greater than, the aforementioned thickness range can also be employed for the gate cap material.

After gate cap formation, the ILD layer is removed by a selective etching process, e.g., a wet buffered diluted HF process to remove the ILD if it is oxide, such that S/D epi 20 is exposed.

Referring now to FIGS. 2A, 2B, 2C, 2D and 2E, there are shown various views of the exemplary semiconductor structure of FIGS. 1A, 1B, 1C, 1D, 1E after forming an organic planarization layer (OPL) 22 in a gap that is located between each gate structure 14 and on each epitaxial source/drain structure 20. The OPL 22 can be composed of an organic polymer that can include polyacrylate resin, epoxy resin, phenol resin, polyamide resin, polyimide resin, unsaturated polyester resin, polyphenylenether resin, polyphenylenesulfide resin, or benzocyclobutene (BCB). The OPL 22 can be formed utilizing a deposition process such as, for example, CVD, PECVD or spin-on coating. In some embodiments, a planarization process can follow the deposition of the organic polymer that provides the OPL 22, or an etch back process can be used to recess the OPL to expose the top of the gate cap 16.

Referring now to FIGS. 3A, 3B, 3C, 3D and 3E, there are shown various views of the exemplary semiconductor structure of FIGS. 2A, 2B, 2C, 2D and 2E after forming a hard mask 24 having an opening 26 which defines a gate cut region in which at least one gate structure 14 will be subsequently cut. In the drawings of the present application, the hard mask 24 has an opening 26 in which the middle two gate structures 14 will be subsequently cut, i.e., removed, while protecting the gate structure 14 on the far right hand side and the gate structure on the far left hand side of the drawings.

The hard mask 24 includes any hard mask material which is compositional different from the gate cap 16 and the dielectric spacer 18. In one example, the hard mask is composed of SiC, or SiCO, or $TiO_x$, or $AlO_x$. The hard mask 24 is formed by first forming a blanket layer of hard mask material and thereafter patterning the blanket layer of hard mask material by lithography and etching. The blanket layer of hard mask material can be formed utilizing a deposition process such as, for example, CVD, PECVD, PVD or ALD. The hard mask 24 can have a thickness from about 10 nm to 50 nm; although other thicknesses for the hard mask 24 are completed and can be used in the present application.

Referring now to FIGS. 4A, 4B, 4C, 4D and 4E, there are shown various views of the exemplary semiconductor structure of FIGS. 3A, 3B, 3C, 3D and 3E after removing the gate cap 16 that is present on each of the gate structures 14 that is located in the gate cut region defined by opening 26 in the hard mask 24, and reducing the height of each gate dielectric spacer 18 that is present in the gate cut region. The gate dielectric spacer that has a reduced height can be referred to as a reduced height gate dielectric spacer 18P. The reduced height gate dielectric spacer 18P has a topmost surface that is coplanar with a topmost surface of the gate structure 14.

The gate cap 16 that is located in the gate cut region can be removed utilizing an etching process that is selective in removing the gate cap 16. In some embodiments, an upper portion of the gate dielectric spacer 18 that is present in the gate cut region can be removed at the same time as the removing of the gate cap 16. In other embodiments, an upper portion of the gate dielectric spacer 18 that is present in the gate cut region can be removed before or after the removal of the gate cap 16 utilizing an etching process that is selective in removing the gate dielectric spacer 18. Each gate structure 14 that is present in the gate cut region is now physically exposed.

Figure 5A:
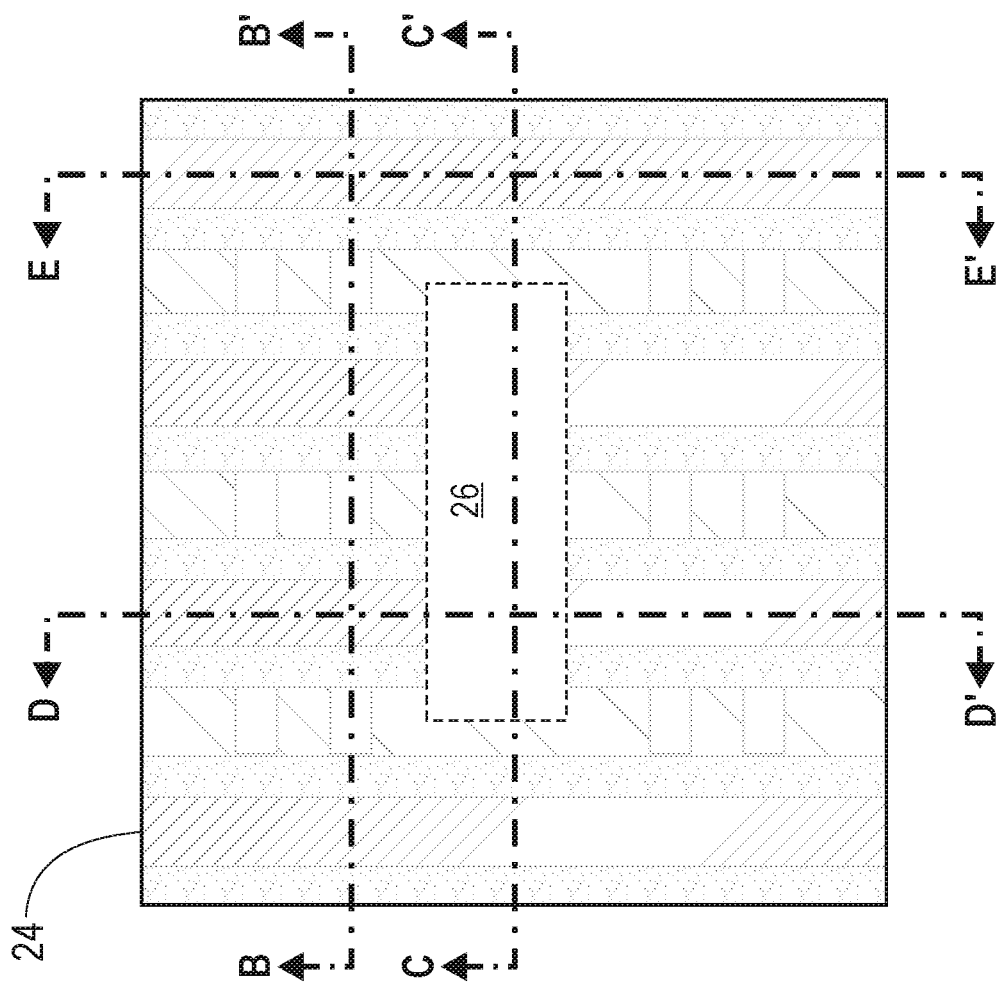
FIG. 5A is a top-down view of the exemplary semiconductor structure of FIG. 4A after removing each of the gate structures in the gate cut region.
Figure 5B:
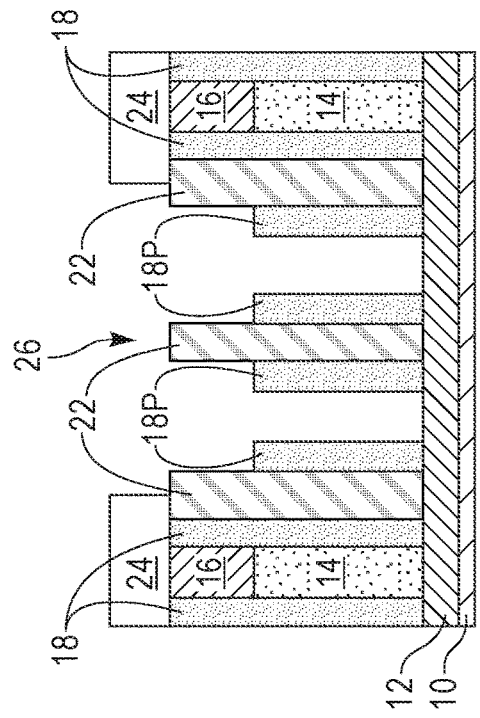
FIG. 5B is a cross sectional view of the exemplary structure of FIG. 5A along cut B-B'.
Figure 5C:
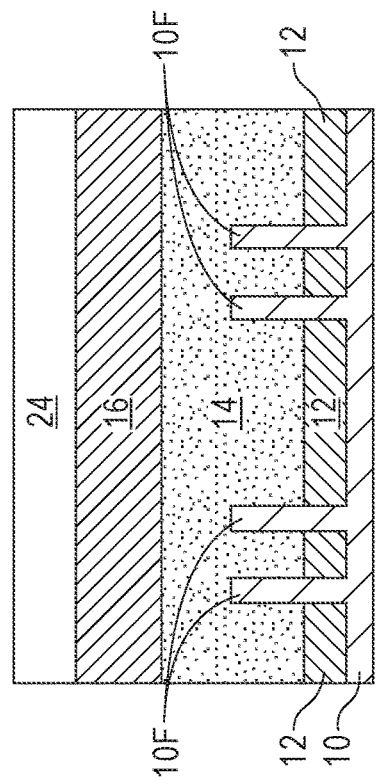
FIG. 5C is a cross sectional view of the exemplary structure of FIG. 5A along cut C-C'.
Figure 5D:
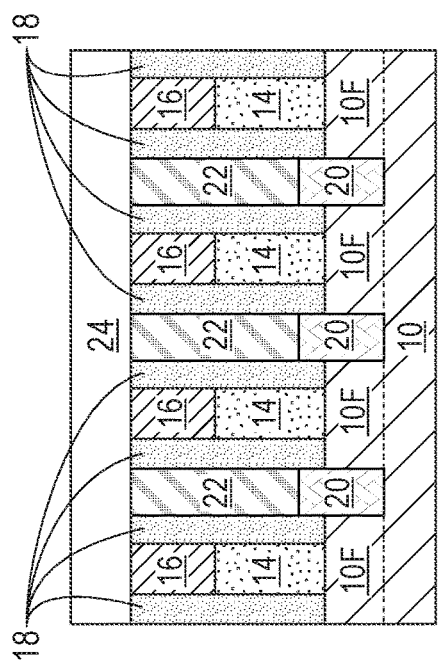
FIG. 5D is a cross sectional view of the exemplary structure of FIG. 5A along cut D-D'.
Figure 5E:
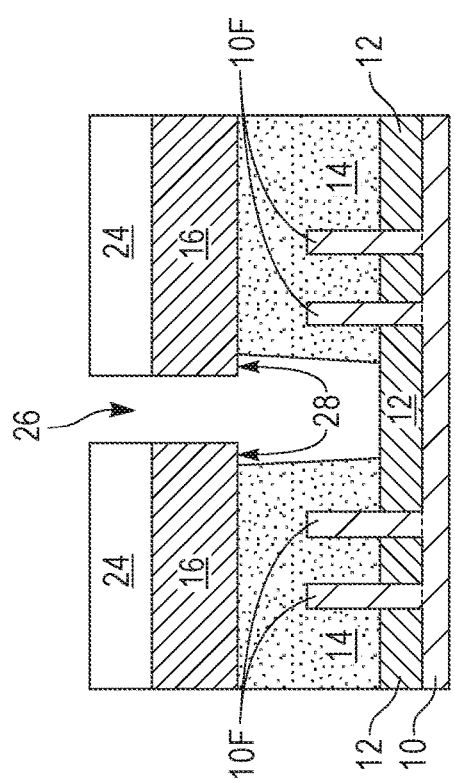
FIG. 5E is a cross sectional view of the exemplary structure of FIG. 5A along cut E-E'.

Referring now to FIGS. 5A, 5B, 5C, 5D and 5E, there are shown various views of the exemplary semiconductor structure of FIGS. 4A, 4B, 4C, 4D and 4E after removing each of the gate structures 14 in the gate cut region; in the gate cut region, portions of the STI region 12 are now physically exposed. Each of the gate structures 14 can be removed utilizing an etching process that is selective in removing the gate structure materials that provide the gate structures 14. In some embodiments and as is shown in FIG. 5D, an undercut region 28 can be formed by the etching process that is used in removing each of the gate structures 14 from the gate cut region. The undercut region 28 is located directly beneath the gate cap 16.

Figure 6A:
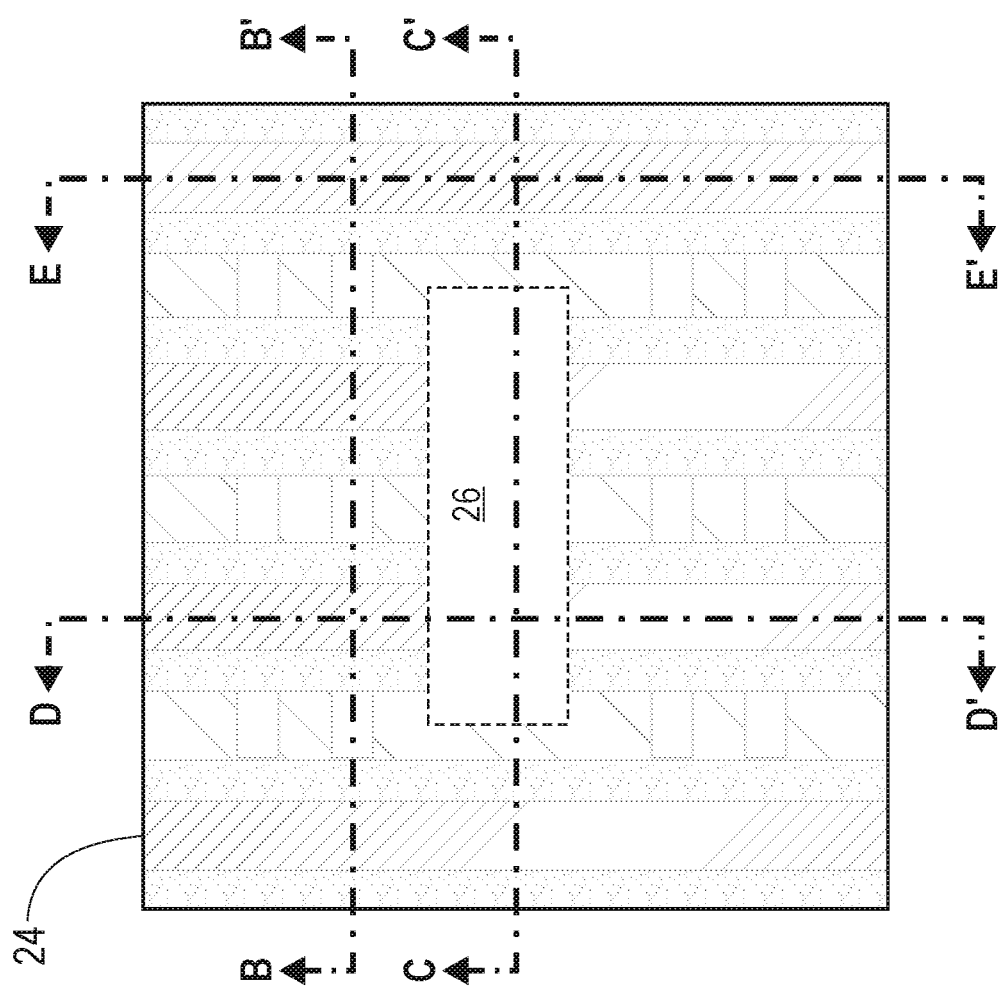
FIG. 6A is a top-down view of the exemplary semiconductor structure of FIG. 5A after forming a silicon nitride layer in the gate cut region and in areas previously including the removed gate structures.
Figure 6B:
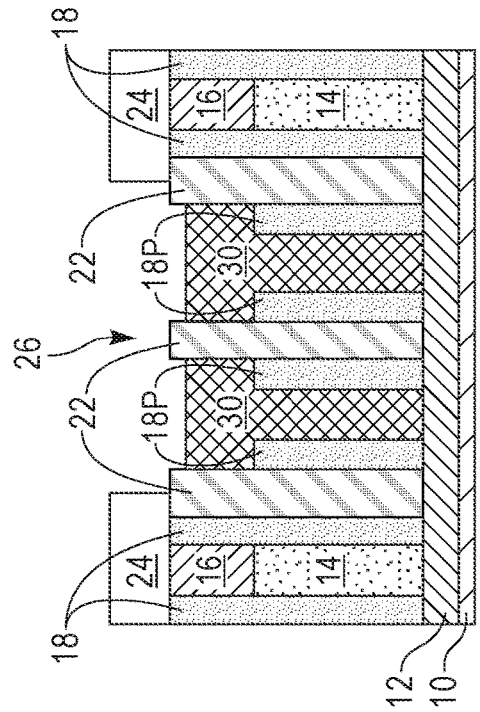
FIG. 6B is a cross sectional view of the exemplary structure of FIG. 6A along cut B-B'.
Figure 6C:
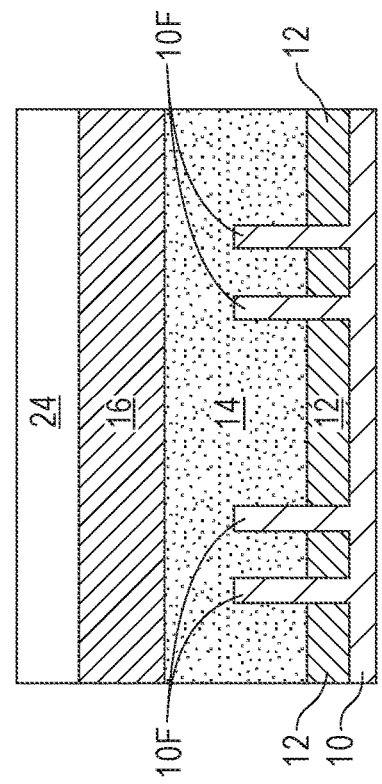
FIG. 6C is a cross sectional view of the exemplary structure of FIG. 6A along cut C-C'.
Figure 6D:
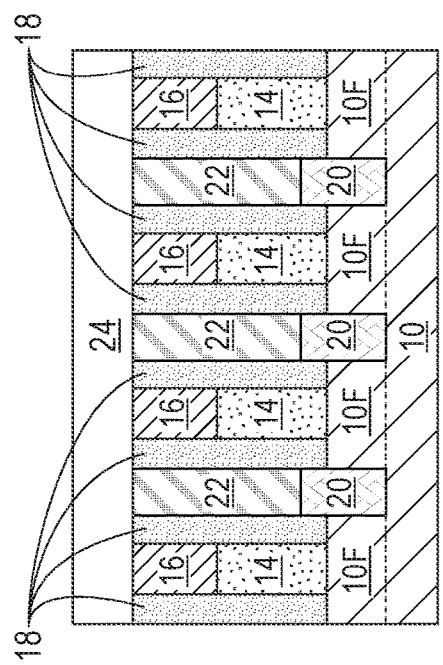
FIG. 6D is a cross sectional view of the exemplary structure of FIG. 6A along cut D-D'.
Figure 6E:
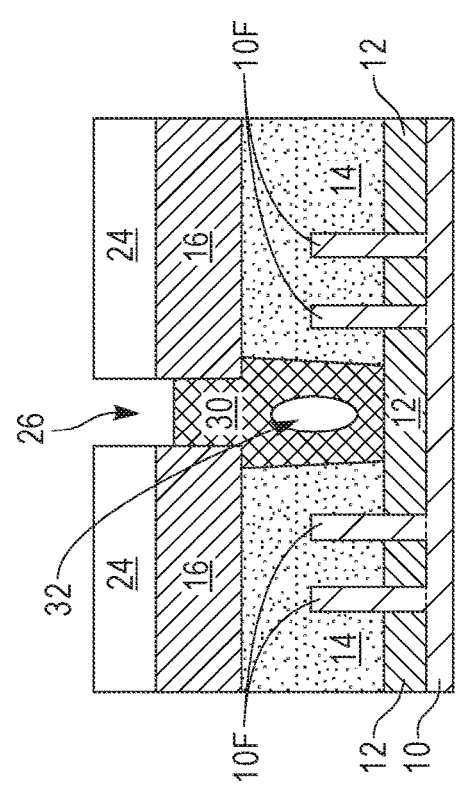
FIG. 6E is a cross sectional view of the exemplary structure of FIG. 6A along cut E-E'.
Figure 7A:
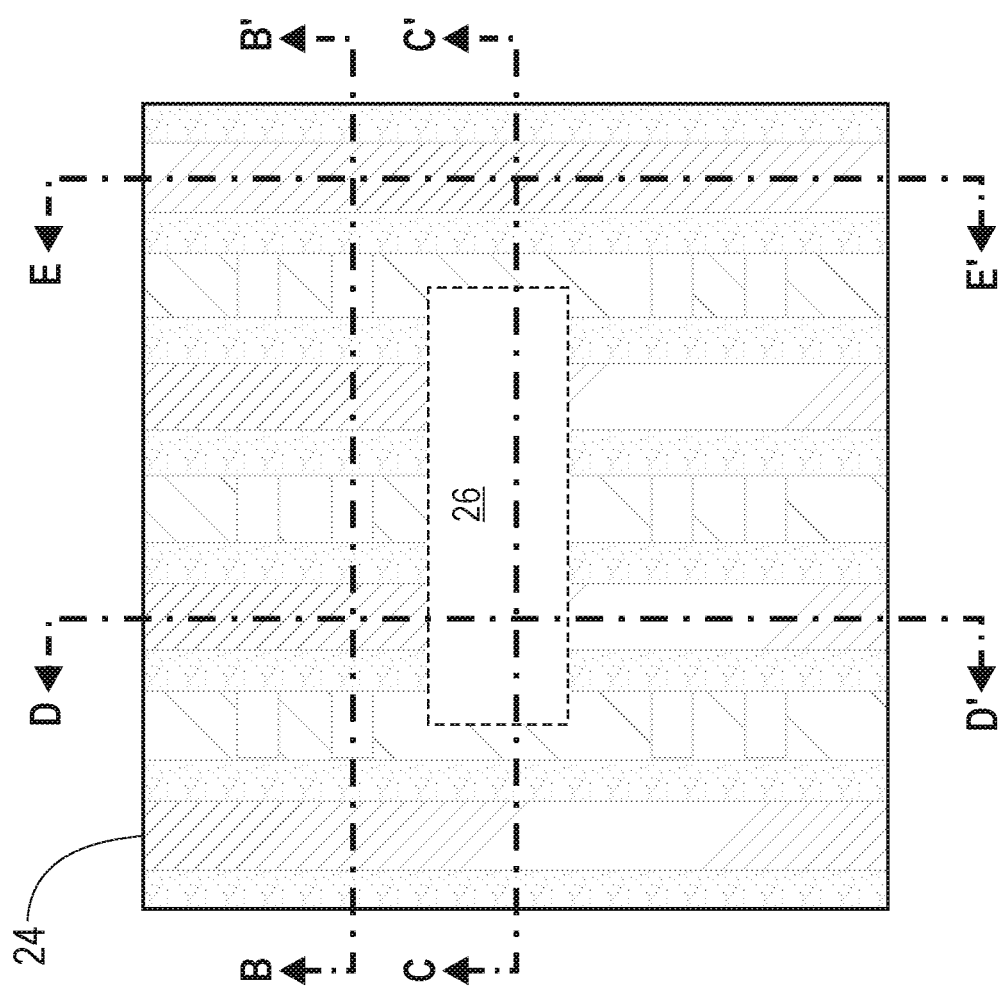
FIG. 7A is a top-down view of the exemplary semiconductor structure of FIG. 6A after removing the physically exposed OPL in the gate cut region.
Figure 7B:
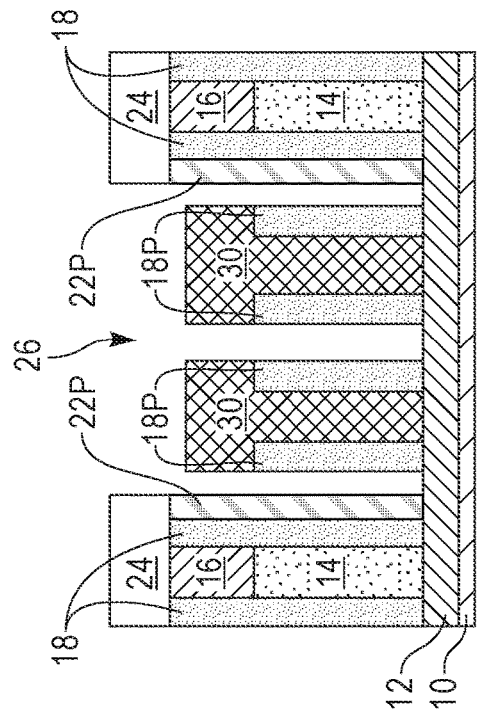
FIG. 7B is a cross sectional view of the exemplary structure of FIG. 7A along cut B-B'.
Figure 7C:
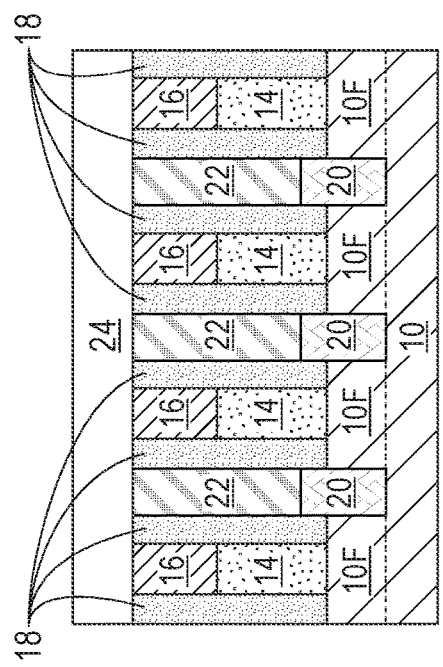
FIG. 7C is a cross sectional view of the exemplary structure of FIG. 7A along cut C-C'.
Figure 7D:
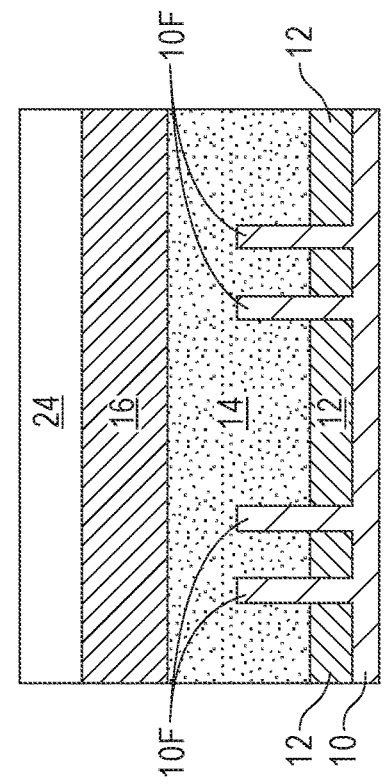
FIG. 7D is a cross sectional view of the exemplary structure of FIG. 7A along cut D-D'.
Figure 7E:
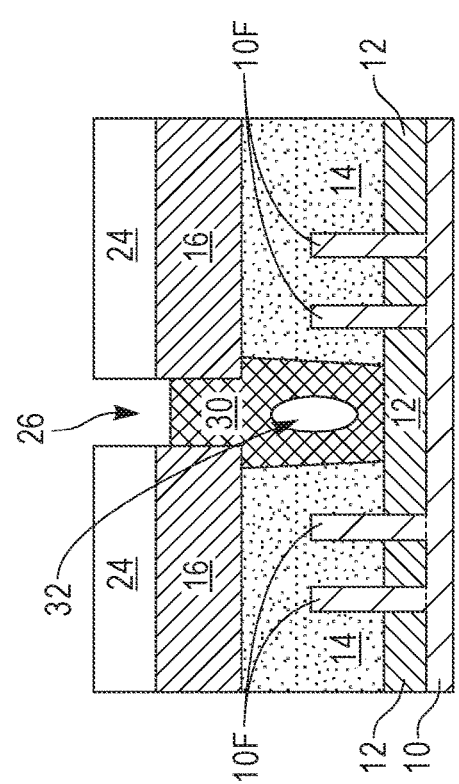
FIG. 7E is a cross sectional view of the exemplary structure of FIG. 7A along cut E-E'.
Figure 8A:
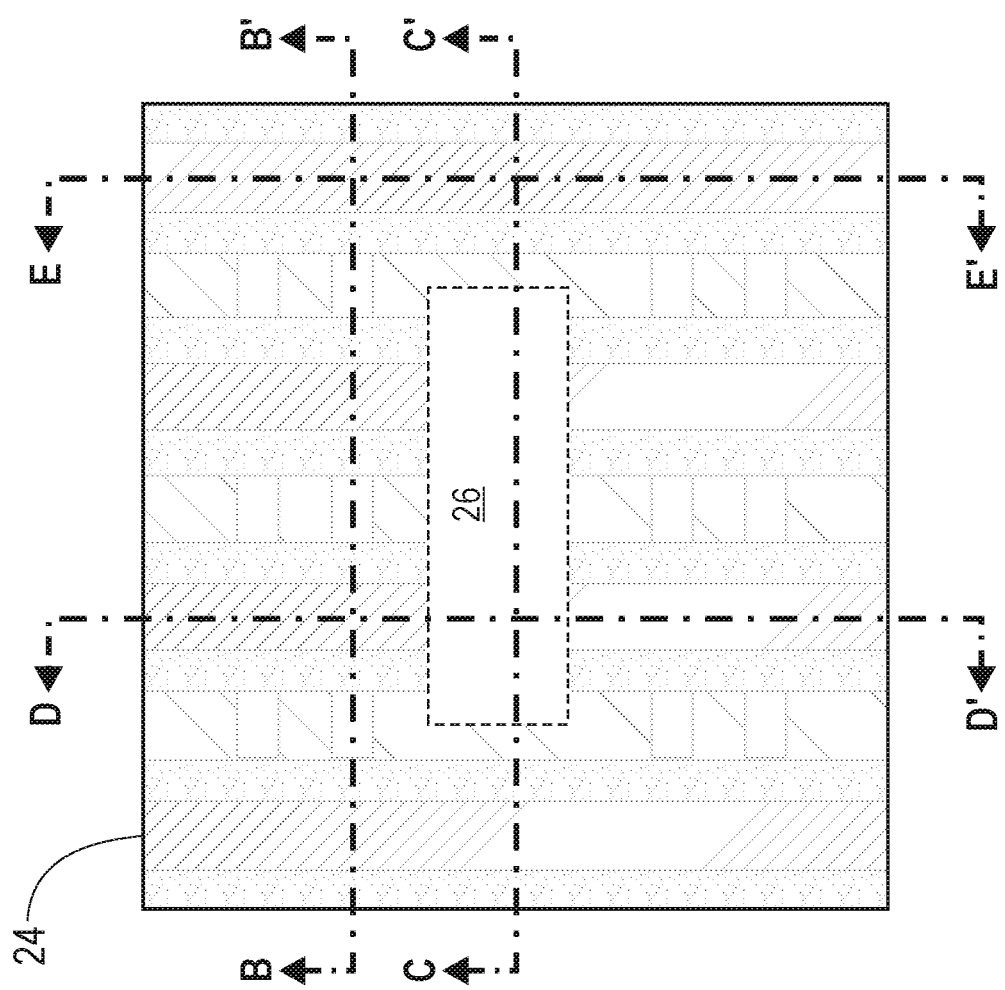
FIG. 8A is a top-down view of the exemplary semiconductor structure of FIG. 7A after thinning the gate dielectric spacers present in the gate cut region.
Figure 8B:
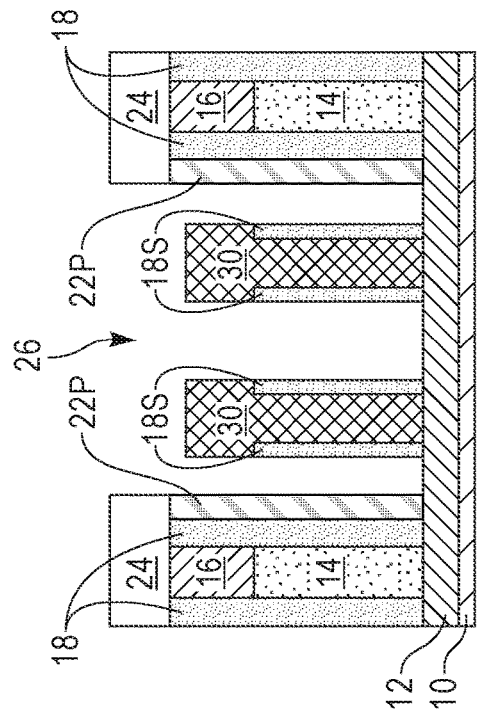
FIG. 8B is a cross sectional view of the exemplary structure of FIG. 8A along cut B-B'.
Figure 8C:
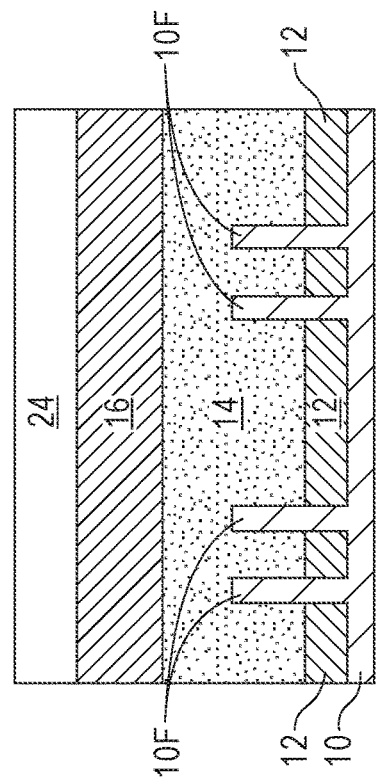
FIG. 8C is a cross sectional view of the exemplary structure of FIG. 8A along cut C-C'.
Figure 8D:
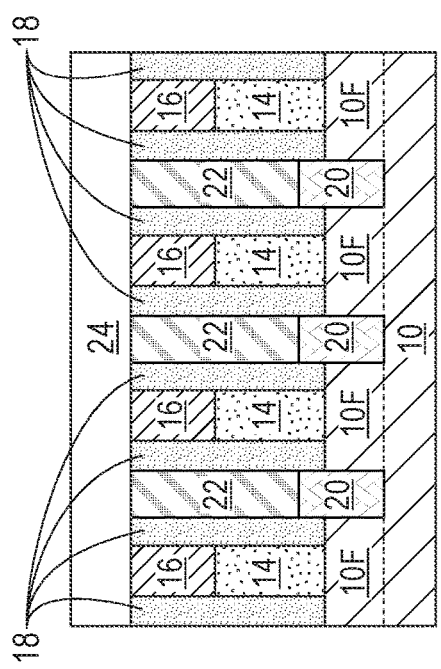
FIG. 8D is a cross sectional view of the exemplary structure of FIG. 8A along cut D-D'.
Figure 8E:
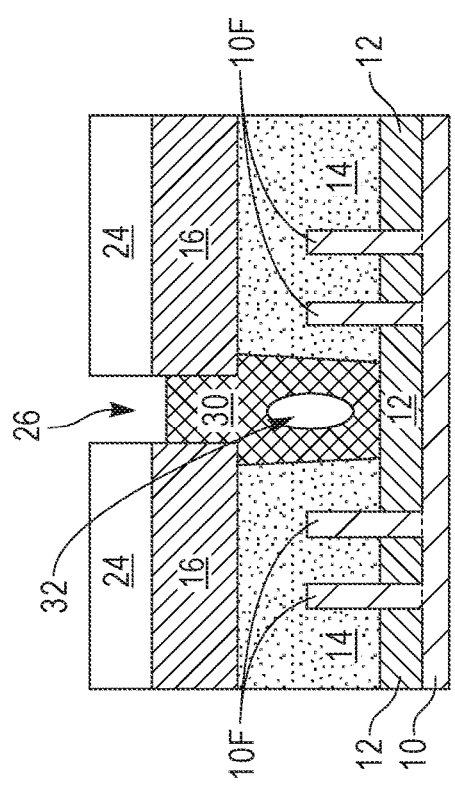
FIG. 8E is a cross sectional view of the exemplary structure of FIG. 8A along cut E-E'.
Figure 9A:
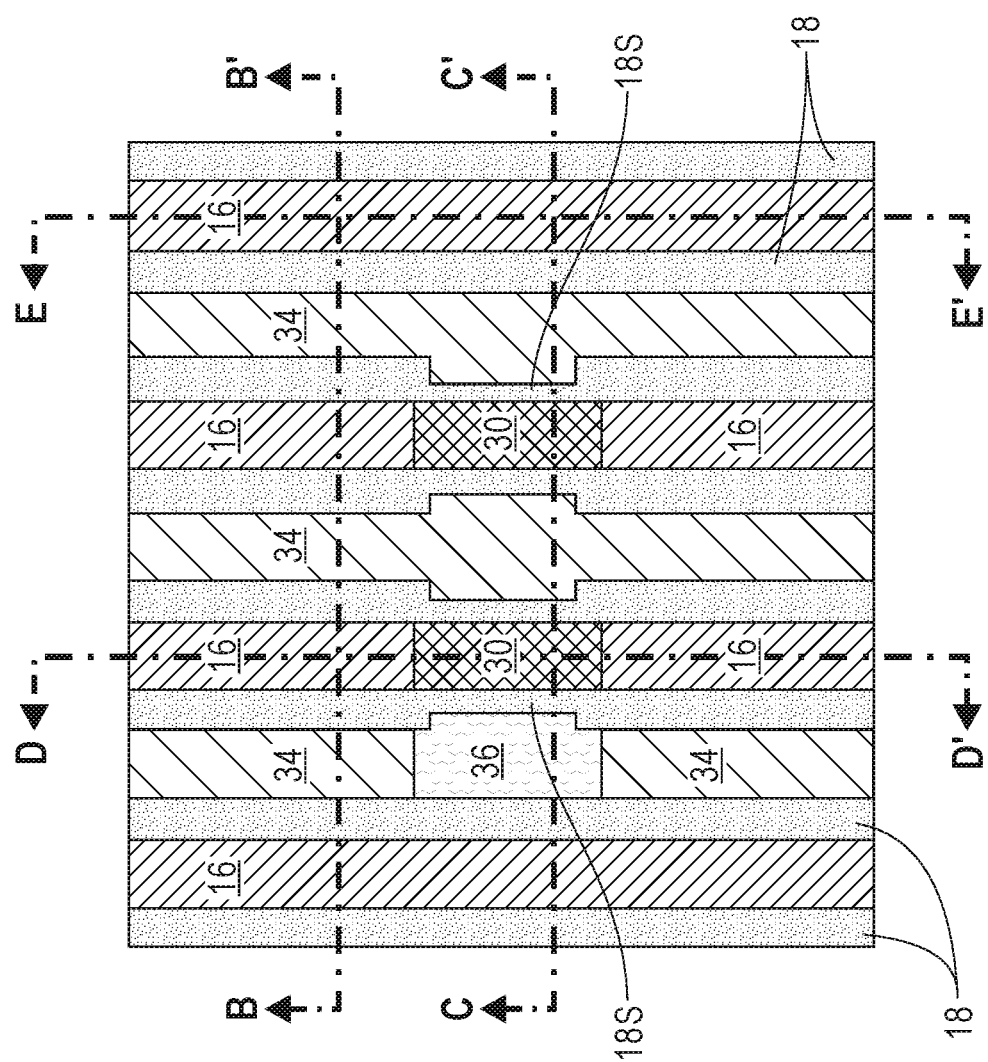
FIG. 9A is a top-down view of the exemplary semiconductor structure of FIG. 8A after removing the hard mask and any remaining OPL, forming metal-containing contact structures laterally adjacent to each gate structure, and cutting at least one of the metal-containing contact structures to provide a metal-containing contact cut region in the gate cut region.
Figure 9C:
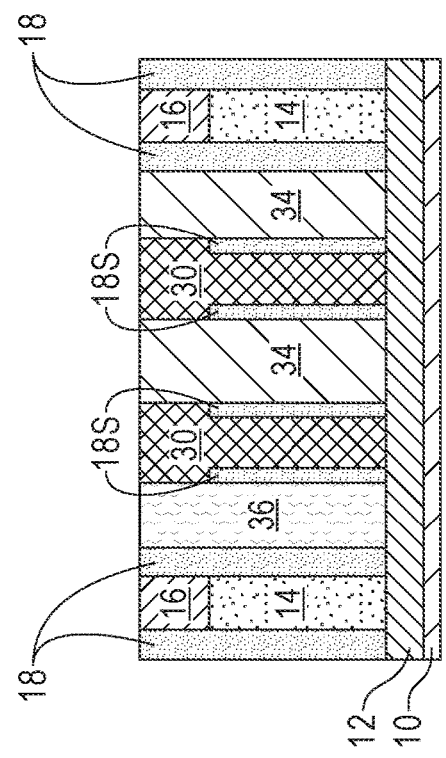
FIG. 9C is a cross sectional view of the exemplary structure of FIG. 9A along cut C-C'.
Figure 9B:
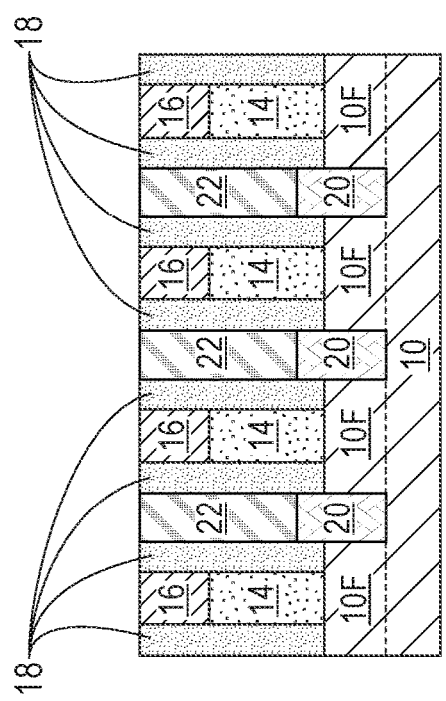
FIG. 9B is a cross sectional view of the exemplary structure of FIG. 9A along cut B-B'.
Figure 9E:
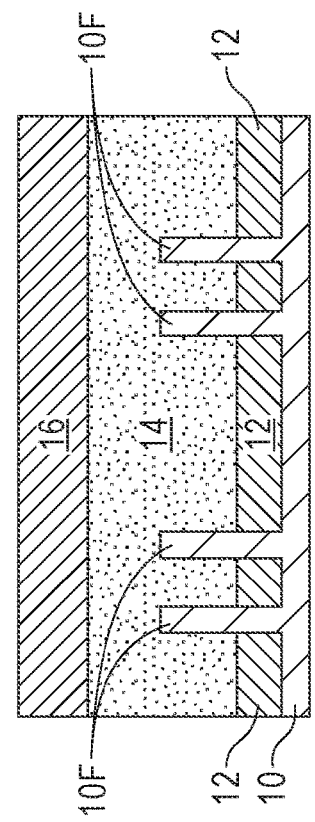
FIG. 9E is a cross sectional view of the exemplary structure of FIG. 9A along cut E-E'.
Figure 9D:
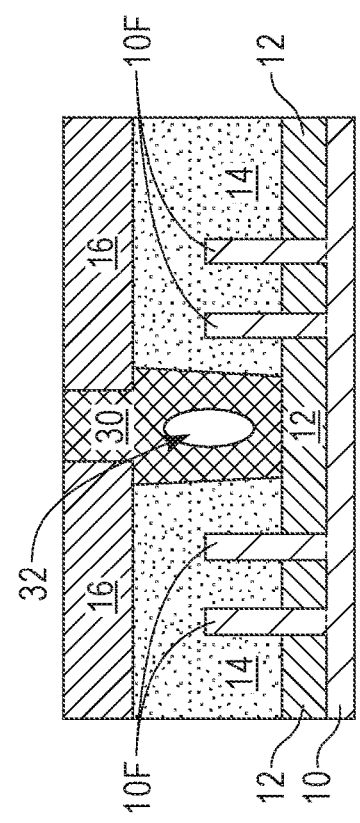
FIG. 9D is a cross sectional view of the exemplary structure of FIG. 9A along cut D-D'.

Referring now to FIGS. 6A, 6B, 6C, 6D and 6E, there are shown various views of the exemplary semiconductor structure of FIGS. 5A, 5B, 5C, 5D and 5E after forming a dielectric isolation layer, such as silicon nitride layer 30 in the gate cut region; the silicon nitride layer 30 is formed in an area previously occupied by the removed gate structure 14. As shown in FIG. 6D, the silicon nitride layer 30 can have a seam 32 located therein. In some embodiments, the silicon nitride layer 30 can be formed by plasma enhanced atomic layer deposition (PEALD). An etch back process can follow the formation of the silicon nitride layer 30. The silicon nitride layer 30 that is formed has a height that is greater than a height of the reduced height gate dielectric spacers 18P, but less than a height of the OPL 22.

Referring now to FIGS. 7A, 7B, 7C, 7D and 7E, there are shown various views of the exemplary semiconductor structure of FIGS. 6A, 6B, 6C, 6D and 6E after removing the physically exposed OPL 22 in the gate cut region. The physically exposed OPL 22 in the gate cut region is removed utilizing an etching process such as, for example, a reactive ion etch, the is selective in removing the polymer that provides the OPL 22. Portions of the OPL 22 that are protected by the hard mask 24 are not removed. The remaining portions of the OPL 22 that are protected by the hard mask 24 are referred herein as an OPL portion 22P.

Referring now to FIGS. 8A, 8B, 8C, 8D and 8E, there are shown various views of the exemplary semiconductor structure of FIGS. 7A, 7B, 7C, 7D and 7E after thinning the gate dielectric spacers (i.e., the reduced height gate dielectric spacers 18P) present in the gate cut region. The reduced height gate dielectric spacers 18P present in the gate cut region can be thinned utilizing an etching process such as, for example, an isotropic vapor phase dry etch. The reduced height and thinned gate dielectric spacers present in the gate cut region have a width that is less than a width of the gate dielectric spacers 18P. The reduced height and thinned gate dielectric spacers present in the gate cut region also have a height that is less than the height of the gate dielectric spacers 18. The reduced height and thinned gate dielectric spacers can be referred to herein a gate cut dielectric spacer 18S. In the present application, the non-reduced height and thinned gate dielectric spacers 18 can be referred to as a first gate dielectric spacer, while the gate cut dielectric spacers 18S can be referred to a second gate dielectric spacer.

Referring now to FIGS. 9A, 9B, 9C, 9D and 9E, there are shown various views of the exemplary semiconductor structure of FIGS. 8A, 8B, 8C, 8D and 8E after removing the hard mask 24 and any remaining OPL 22, forming metal-containing contact structures 34 laterally adjacent to each gate structure 14, and cutting at least one of the metal-containing contact structures to provide a metal-containing contact cut region 36 near the gate cut region. In some embodiments, the cutting of at least one of the metal-containing contact structure is optional, which the contact cut process is done before gate cut.

In the present application, the hard mask 24 can be removed utilizing any conventional material removal process including, for example, a planarization process or etching, and the remaining OPL layer 22 (i.e., OPL portion 22P) can be removed utilizing an etching process that is selective in removing the polymer that provides the OPL portion 22P).

The metal-containing contact structures 34 are then formed laterally adjacent to each gate structure 14 and atop the epitaxial source/drain structures 30. The metal-containing contact structures 34. The metal-containing contact structures 34 are formed utilizing techniques well known to those skilled in the art. In one example, the metal-containing contact structures 34 can be formed by deposition and planarization. In some embodiments, the metal-containing contact structures 34 can be composed of a contact metal or a contact metal alloy such as, for example, tungsten (W), cobalt (Co), platinum (Pt), nickel (Ni) or alloys thereof. In other embodiments, the metal-containing contact structures 34 can be composed of a metal silicide such as, for example, cobalt silicide, tungsten silicide, nickel silicide, platinum silicide, titanium silicide, nickel-platinum (Ni—Pt) silicide, etc.

In some embodiments, at least one of the metal-containing contact structures 34 is cut to provide a metal-containing contact cut region 36 near the gate cut region. The cutting at least one of the metal-containing contact structures 34 can be performed by lithography and etching. When cutting of at least one of the metal-containing contact structures 34 is performed, a metal-containing contact cut region 36 is provided in the gate cut region.

FIGS. 9A-9E illustrates an exemplary semiconductor structure including a gate cut region in which the contact trench size has been optimized to increase local interconnect connectivity. Notably, the exemplary structure of FIGS. 9A-9E includes at least one gate structure 14 located laterally adjacent to a gate cut region. At least one metal-containing contact structure 34 is located in the gate cut region, wherein the at least one at least one metal-containing contact structure 34 is confined by a pair of gate dielectric spacers (18, 18S), wherein a first gate dielectric spacer 18 of the pair of gate dielectric spacers (18, 18S) has a first width and is located laterally adjacent to the at least one gate structure 14, and a second gate dielectric spacer 18S of the pair of gate dielectric spacers (18, 18S) has a second width and is located laterally adjacent to the at least one metal-containing contact structure 34, wherein the first width is greater than the second width.

The exemplary semiconductor structure shown in FIGS. 9A-9E can include at least one metal-containing contact cut region 36 in the gate cut region and laterally adjacent to the at least one metal-containing contact structure 34, wherein the at least one metal-containing contact cut region 36 is confined by another pair of gate dielectric spacers (18, 18S), wherein a first gate dielectric spacer 18 of the another pair of gate dielectric spacers (18, 18S) has the first width and is located laterally adjacent to another gate structure 14, and a second gate dielectric spacer 18S of the another pair of gate dielectric spacers (18, 18S) has the second width.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
at least one gate structure located laterally adjacent to a gate cut region;
at least one metal-containing contact structure located in the gate cut region, wherein the at least one at least one metal-containing contact structure is confined by a pair of gate dielectric spacers, wherein a first gate dielectric spacer of the pair of gate dielectric spacers has a first width and is located laterally adjacent to the at least one gate structure, and a second gate dielectric spacer of the pair of gate dielectric spacers has a second width and is located laterally adjacent to the at least one metal-containing contact structure, wherein the first width is greater than the second width; and
a gate cap located on the at least one gate structure, wherein the gate cap has a topmost surface that is coplanar with a topmost surface of each of the first dielectric spacer, and the at least one metal-containing contact structure.

2. The semiconductor structure of claim 1, wherein the first dielectric spacer of the pair of gate dielectric spacers has a first height and the second dielectric spacer of the pair of gate dielectric spacers has a second height that is less than the first height.

3. The semiconductor structure of claim 1, wherein the at least one gate structure is located on a surface of a semiconductor fin.

4. The semiconductor structure of claim 1, wherein the at least one metal-containing contact structure is located on a surface of an epitaxial source/drain structure that is located laterally adjacent to the at least one gate structure.

5. The semiconductor structure of claim 1, further comprising at least one metal-containing contact cut region in the gate cut region and laterally adjacent to the at least one metal-containing contact structure, wherein the at least one metal-containing contact cut region is confined by another pair of gate dielectric spacers, wherein a first gate dielectric spacer of the another pair of gate dielectric spacers has the first width and is located laterally adjacent to another gate structure, and a second gate dielectric spacer of the another pair of gate dielectric spacers has the second width.

6. The semiconductor structure of claim 1, further comprising a silicon nitride layer located laterally adjacent to the at least one metal-containing contact structure, wherein the silicon nitride layer is confined by the second gate dielectric spacer of the pair of gate dielectric spacers and another second gate dielectric spacer having the second width.

7. The semiconductor structure of claim 6, wherein the silicon nitride layer has a seam present therein.

8. The semiconductor structure of claim 1, wherein the at least one metal-containing contact structure located in the gate cut region and the pair of gate dielectric spacers are located on a surface of a shallow trench isolation region.

9. A semiconductor structure comprising:
at least one gate structure located laterally adjacent to a gate cut region;
at least one metal-containing contact structure located in the gate cut region, wherein the at least one at least one metal-containing contact structure is confined by a first pair of gate dielectric spacers, wherein a first gate dielectric spacer of the first pair of gate dielectric spacers has a first width and is located laterally adjacent to the at least one gate structure, and a second gate dielectric spacer of the first pair of gate dielectric spacers has a second width and is located laterally adjacent to the at least one metal-containing contact structure, wherein the first width is greater than the second width; and at least one metal-containing contact cut region present in the gate cut region and laterally adjacent to the at least one metal-containing contact structure, wherein the at least one metal-containing contact cut region is confined by a second pair of gate dielectric spacers, wherein a first gate dielectric spacer of the second pair of gate dielectric spacers has the first width and is located laterally adjacent to the at least one gate structure, and a second gate dielectric spacer of the second pair of gate dielectric spacers has the second width and is laterally adjacent to the at least one metal-containing contact cut region.

10. The semiconductor structure of claim 9, wherein the first dielectric spacer of the second pair of gate dielectric spacers has a first height and the second dielectric spacer of the second pair of gate dielectric spacers has a second height that is less than the first height.

11. The semiconductor structure of claim 9, further comprising a silicon nitride layer located laterally adjacent to the at least one metal-containing contact structure, wherein the silicon nitride layer is confined by the second gate dielectric spacer of the first pair of gate dielectric spacers and the second gate dielectric spacer of the second pair of gate dielectric spacers.

12. The semiconductor structure of claim 11, wherein the silicon nitride layer has a seam present therein.

13. The semiconductor structure of claim 9, wherein the at least one metal-containing contact cut region and the second pair of gate dielectric spacers are located on a surface of a shallow trench isolation region.

14. A method of forming a semiconductor structure, the method comprising:

forming a plurality of gate structures, wherein a gate dielectric spacer is located on a sidewall of each gate structure and an epitaxial source/drain structure is located on each side of the gate structures;

forming an organic planarization layer (OPL) in a gap that is located between each gate structure and on each epitaxial source/drain structure;

forming a hard mask having an opening which defines a gate cut region in which at least one gate structure will be subsequently cut;

reducing a height of each gate dielectric spacer that is present in the gate cut region;

removing each of the gate structures in the gate cut region;

forming a silicon nitride layer in the gate cut region and in an area previously occupied by a removed gate structure;

removing physically exposed portions of the OPL in the gate cut region;

thinning the gate dielectric spacers present in the gate cut region;

removing the hard mask and remaining OPL; and forming at least one metal-containing contact structure in the gate cut region and laterally adjacent to each gate structure.

15. The method of claim 14, further comprising cutting at least one of the metal-containing contact structures to provide a metal-containing contact cut region in the gate cut region.

16. The method of claim 14, wherein a gate cap is located on each gate structure of the plurality of gate structures, and wherein the gate cap is removed from each gate structure in the gate cut region prior to the removing of the gate structures in the gate cut region.

17. The method of claim 14, wherein the removing each of the gate structures in the gate cut region provides an undercut region beneath the hard mask.

18. The method of claim 14, wherein the forming of the silicon nitride layer comprises physical enhanced atomic layer deposition.

19. The method of claim 18, wherein the silicon nitride layer has a seam present therein.

* * * * *